(12) United States Patent
Harada et al.

(10) Patent No.: US 7,498,902 B2
(45) Date of Patent: Mar. 3, 2009

(54) BALANCED/UNBALANCED FILTER MODULE AND COMMUNICATION APPARATUS

(75) Inventors: Tetsuro Harada, Otsu (JP); Naoto Yamaguchi, Moriyama (JP); Naoki Nakayama, Sakai (JP); Takanori Uejima, Moriyama (JP); Hidehiro Takano, Kyoto (JP); Koki Saito, Ibaraki (JP)

(73) Assignee: Murata Manufacturing Co., Ltd, Kyoto (JP)

( * ) Notice: Subject to any disclaimer, the term of this patent is extended or adjusted under 35 U.S.C. 154(b) by 0 days.

(21) Appl. No.: 11/766,868

(22) Filed: Jun. 22, 2007

(65) Prior Publication Data

US 2008/0122554 A1 May 29, 2008

Related U.S. Application Data

(63) Continuation of application No. PCT/JP2005/023106, filed on Dec. 16, 2005.

(30) Foreign Application Priority Data

Dec. 28, 2004 (JP) .............................. 2004-381954

(51) Int. Cl.
*H03H 9/70* (2006.01)
*H03H 9/72* (2006.01)

(52) U.S. Cl. ......................................... 333/133; 455/83

(58) Field of Classification Search .................. 333/133, 333/193, 189
See application file for complete search history.

(56) References Cited

U.S. PATENT DOCUMENTS 6,115,592 A    9/2000  Ueda et al.
6,204,737 B1   3/2001  Ella
6,242,843 B1   6/2001  Pohjonen et al.
6,606,016 B2   8/2003  Takamine
6,713,940 B2   3/2004  Takamine
6,900,705 B2   5/2005  Nakamura et al.
7,176,768 B2   2/2007  Nakamura et al.
7,224,240 B2   5/2007  Nakamura et al.
2007/0030095 A1*  2/2007  Hikita et al. ................ 333/133

FOREIGN PATENT DOCUMENTS

EP    1 557 994 A2    7/2005
JP    05-046111 U     6/1993
JP    05-327403 A    12/1993
JP    09-121138 A     5/1997

(Continued)

OTHER PUBLICATIONS

Machine translation of JP 2004-297633, published Oct. 21, 2004.*
Official Communication for PCT Application No. PCT/JP2005/023106; mailed Apr. 4, 2006.

*Primary Examiner*—Barbara Summons
(74) *Attorney, Agent, or Firm*—Keating & Bennett, LLP

(57) ABSTRACT

A balanced/unbalanced filter module includes a switch including a first port that inputs and outputs unbalanced signals in a first frequency band, a second port that inputs and outputs unbalanced signals in a second frequency band, and a third port that inputs and outputs unbalanced signals in these two frequency bands. The switch switches a signal path. An unbalanced I/O port of a first filter that passes signals in the first frequency band is connected to the port. A port of a second filter that passes signals in the second frequency band is connected to the port. Individual balanced I/O ports of each of the first and second filters are connected to first and second branch ports with substantially the same electrical length. A balance coil for impedance matching is provided between the first and second branch ports.

24 Claims, 14 Drawing Sheets

FOREIGN PATENT DOCUMENTS

| | | | |
|---|---|---|---|
| JP | 2000-030594 A | 1/2000 | |
| JP | 2001-326557 A | 11/2001 | |
| JP | 2002-208832 A | 7/2002 | |
| JP | 2003-142981 A | 5/2003 | |
| JP | 2003-338724 A | 11/2003 | |
| JP | 2004-166258 A | 6/2004 | |
| JP | 2004-297633 | * | 10/2004 |
| JP | 2005-065171 A | 3/2005 | |

* cited by examiner

SL2
SLb

SLd

SCc

SCc

SL2

FIG. 11F    SCc

SL2
SLb

FIG. 11G    SCc

SL2

SLd
SLb

BALANCED/UNBALANCED FILTER MODULE AND COMMUNICATION APPARATUS

FIELD OF THE INVENTION

The present invention relates to a balanced/unbalanced filter module that inputs and outputs signals in two different frequency bands and a communication apparatus including such a balanced/unbalanced filter module.

DESCRIPTION OF THE RELATED ART

A conventional balanced/unbalanced multi-band filter module that inputs and outputs signals in two different frequency bands is disclosed in Patent Document 1.

FIGS. 14 and 15 show the structures of typical filter modules disclosed in Japanese Unexamined Patent Application Publication No. 2004-166258.

In FIG. 14, a first port 100a of a first high frequency switch 10a is connected to an unbalanced port P1 of the filter module. The high frequency switch 10a is a switch that includes three ports. An unbalanced port 110a of a first balanced/unbalanced band-pass filter 20a is connected to a second port 100b of the first high frequency switch 10a, and an unbalanced port 120a of a second balanced/unbalanced band-pass filter 20b is connected to a third port 100c of the first high frequency switch 10a. A second high frequency switch 10b and a third high frequency switch 10c, each including three ports, are connected to the first and second balanced/unbalanced band-pass filters 20a and 20b.

A first port 130a of the second high frequency switch is connected to a first balanced port P2-1 of the filter module. A first balanced port 110b of the first balanced/unbalanced band-pass filter 20a is connected to a second port 130b of the second high frequency switch, and a first balanced port 120b of the second balanced/unbalanced band-pass filter 20b is connected to a third port 130c of the second high frequency switch.

A first port 150a of the third high frequency switch is connected to a second balanced port P2-2 of the filter module. A second port 150b of the third high frequency switch is connected to a second balanced port 110c of the first balanced/unbalanced band-pass filter 20a. A second balanced port 120c of the second balanced/unbalanced band-pass filter 20b is connected to a third port 150c of the third high frequency switch.

The filter module shown in FIG. 15 mainly includes high frequency switches that include switching elements, balanced/unbalanced band-pass filters that have different pass frequency bands, and phase shifters that are connected to the balanced/unbalanced band-pass filters. A first port 100a of a first high frequency switch 10a is connected to an unbalanced port P1 of a high frequency switch. An unbalanced port 110a of a first balanced/unbalanced band-pass filter 20a is connected to a second port 100b of the first high frequency switch 10a. An unbalanced port 120a of a second balanced/unbalanced band-pass filter 20b is connected to a third port 100c of the first high frequency switch 10a.

A first balanced port 110b of the first balanced/unbalanced band-pass filter 20a is connected to a first port 160b of a first phase shifter 50a. A second port 160c of the first phase shifter 50a is connected to a first balanced port P2-1 of the filter module. A second balanced port 110c of the first balanced/unbalanced band-pass filter 20a is connected to a first port 170b of a second phase shifter 50b. A second port 170c of the second phase shifter 50b is connected to a second balanced port P2-2 of the filter module. A first balanced port 120b of the second balanced/unbalanced band-pass filter 20b is connected to a first port 160d of a third phase shifter 60a. A second port 160e of the third phase shifter 60a is connected to the first balanced port P2-1 of the filter module. A second balanced port 120c of the second balanced/unbalanced band-pass filter 20b is connected to a first port 170d of a fourth phase shifter 60b. A second port 170e of the fourth phase shifter 60b is connected to the second balanced port P2-2 of the filter module.

However, in the conventional balanced/unbalanced filter module shown in FIG. 14, the switches 10b and 10c are required on the side of the balanced ports for inputting and outputting balanced signals. Thus, a problem exists in that the size of the circuit is large. Moreover, in the conventional balanced/unbalanced filter module shown in FIG. 15, when matching circuits are provided on the side of the balanced ports for impedance matching with the circuits connected to the balanced ports, matching circuits (phase shifters) for four paths of the individual ports are required. In both cases, the number of parts is large, thereby disadvantageously affecting the miniaturization.

SUMMARY OF THE INVENTION

In order to overcome the problems described above, preferred embodiments of the present invention provide a small and low-cost balanced/unbalanced filter module that inputs and outputs signals in two frequency bands and a communication apparatus that includes this filter module.

A balanced/unbalanced filter module according to a preferred embodiment of the present invention includes a switch that includes a first port, a second port, and a third port and switches between a signal path between the third port and the first port and a signal path between the third port and the second port, the first port inputting and outputting unbalanced signals in a first frequency band, the second port inputting and outputting unbalanced signals in a second frequency band, the third port inputting and outputting unbalanced signals in the first frequency band and unbalanced signals in the second frequency band, a first balanced/unbalanced filter that includes a fourth port, a fifth port, and a sixth port, the fourth port being connected to the first port and inputting and outputting unbalanced signals in the first frequency band, the fifth and sixth ports inputting and outputting balanced signals in the first frequency band, a pass band of the first balanced/unbalanced filter being the first frequency band, a second balanced/unbalanced filter that includes a seventh port, an eighth port, and a ninth port, the seventh port being connected to the second port and inputting and outputting unbalanced signals in the second frequency band, the eighth and ninth ports inputting and outputting balanced signals in the second frequency band, a pass band of the second balanced/unbalanced filter being the second frequency band, and a matching element that is provided between a first branch port and a second branch port and performs impedance matching for balanced signals in the first frequency band and balanced signals in the second frequency band, the first branch port being connected to the fifth and eighth ports, the second branch port being connected to the sixth and ninth ports.

For example, the first and second balanced/unbalanced filters may be balanced/unbalanced surface acoustic wave filters or bulk acoustic filters.

For example, the switch, the first and second balanced/unbalanced filters, and the matching element may be integrated into a laminate including a plurality of dielectric layers.

The switch may include a capacitor, an inductor, and a diode, and the matching element may be located so as not to overlap the capacitor, the inductor, or the diode, as viewed from the top in the direction of stacking the dielectric layers.

The first and second balanced/unbalanced filters may be packaged into one package, and the package may be placed on the uppermost layer of the laminate so that the package covers the center of a plane surface of the uppermost layer of the laminate.

A control signal input terminal for inputting control signals, a first I/O port terminal that is connected to the first branch port, a second I/O port terminal that is connected to the second branch port, and a third port terminal that is connected to the third port may be formed on a back surface of the lowermost layer of the laminate, and a GND terminal may be provided between the individual terminals.

The laminate may include a GND layer that includes a ground electrode, via holes that are electrically connected to the individual terminals may be formed in the GND layer, and the ground electrode may be provided between the via holes.

Wiring on a balanced side and wiring on an unbalanced side of the first and second balanced/unbalanced filters may be provided in the laminate so that positions of the wiring on the balanced side and the wiring on the unbalanced side do not overlap each other above a plane, as viewed from the top in the direction of stacking the dielectric layers.

A GND layer may be provided between wiring on a balanced side and wiring on an unbalanced side of the first and second balanced/unbalanced filters at portions of the wiring on the balanced side and the wiring on the unbalanced side, the portions overlapping each other above a plane, as viewed from the top in the direction of stacking the dielectric layers.

The electrical length between the fifth port and the first branch port in the first frequency band may be substantially the same as the electrical length between the sixth port and the second branch port in the first frequency band, and the electrical length between the eighth port and the first branch port in the second frequency band may be substantially the same as the electrical length between the ninth port and the second branch port in the second frequency band.

A communication apparatus according to another preferred embodiment of the present invention includes a balanced/unbalanced filter module that includes any one of the aforementioned structures in a high frequency circuit thereof.

The matching element, which performs impedance matching for balanced signals in the first frequency band and balanced signals in the second frequency band, is provided together with the switch and the first and second balanced/unbalanced filters. Thus, a small and low-cost balanced/unbalanced filter module can be fabricated with a small number of parts without the two switches being provided for the balanced ports for inputting and outputting balanced signals and without the phase shifters for the four paths on the side of the balanced ports. Moreover, for example, chip set for triple bands for unbalanced I/O can be readily connected.

When balanced/unbalanced surface acoustic wave filters or bulk acoustic filters are adopted as the first and second balanced/unbalanced filters, signals in the pass band for one filter is blocked by the other filter. Thus, leakage of signals can be reduced, thereby reducing loss.

When the switch, the first and second balanced/unbalanced filters, and the matching element are integrated into a laminate including a plurality of dielectric layers, a matching circuit can be readily provided in the laminate and the first and second balanced/unbalanced filters can be mounted on a surface of the laminate, thereby advantageously achieving the miniaturization.

The switch includes the capacitor, the inductor, and the diode, and the matching element is provided in a position that does not overlap the capacitor, the inductor, or the diode, as viewed from the top in the direction of stacking the dielectric layers. Thus, the capacitor, the inductor, and the diode and the matching element do not affect each other. Accordingly, the miniaturization can be achieved without impairing the circuit characteristics even when the matching element is integrated into the dielectric laminate.

Since the SAW filters placed on the uppermost layer of the laminate are packaged and the upper surface is flat, the balanced/unbalanced filter module can be attached using this flat surface. Thus, sealing the laminate with resin or installation of a metal casing in the laminate is not required. Accordingly, the balanced/unbalanced filter module can be manufactured at low cost, and stable handling can be achieved.

The control signal input terminal, the first I/O port terminal, the second I/O port terminal, and the third port terminal are formed on the back surface of the lowermost layer of the laminate, and the GND terminal is provided between the individual terminals. Thus, the individual terminals can be prevented from interfering with each other, thereby reducing signal loss.

The laminate includes the GND layer that includes the ground electrode, the via holes that are electrically connected to the individual terminals are formed in the GND layer, and the ground electrode is provided between the via holes. Thus, the via holes can be prevented from interfering with each other, thereby reducing signal loss.

The wiring on the balanced side and the wiring on the unbalanced side of the first and second balanced/unbalanced filters are provided in the laminate so that the positions of the wiring on the balanced side and the wiring on the unbalanced side do not overlap each other above a plane, as viewed from the top in the direction of stacking the dielectric layers. Thus, interference between signals on the balanced side and signals on the unbalanced side can be effectively prevented.

The GND layer is provided between the wiring on the balanced side and the wiring on the unbalanced side of the first and second balanced/unbalanced filters at portions of the wiring on the balanced side and the wiring on the unbalanced side, the portions overlapping each other above a plane, as viewed from the top in the direction of stacking the dielectric layers. Thus, interference between signals on the balanced side and signals on the unbalanced side can be effectively prevented.

The electrical length between the fifth port and the first branch port in the first frequency band is substantially the same as the electrical length between the sixth port and the second branch port in the first frequency band, and the electrical length between the eighth port and the first branch port in the second frequency band is substantially the same as the electrical length between the ninth port and the second branch port in the second frequency band. Thus, the matching element is connected to positions where phases are equal as viewed from the balanced ports of the first and second balanced/unbalanced filters. Accordingly, the wiring between these ports and addition of the matching element do not impair balancing characteristics. That is to say, since the electrical length between the fifth port and the first branch port is substantially the same as the electrical length between the sixth port and the second branch port in the first frequency band, balancing characteristics in the first frequency band can be maintained. Since the electrical length between the eighth port and the first branch port is substantially the same as the electrical length between the ninth port and the second branch port in the second frequency band, balancing characteristics in the second frequency band can be maintained. Thus, satisfactory electrical characteristics can be maintained.

The communication apparatus includes the aforementioned balanced/unbalanced filter module in the high frequency circuit thereof. Thus, a small and low-cost communication apparatus that can handle a plurality of types of communication signals in different frequency bands can be fabricated.

Other features, elements, steps, characteristics and advantages of the present invention will be described below with reference to preferred embodiments thereof and the attached drawings.

BRIEF DESCRIPTION OF THE DRAWINGS

FIGS. 3A to 3G show conductor patterns in dielectric layers in a case where the filter module includes a laminate of the dielectric layers.

FIGS. 11A to 11G show conductor patterns in dielectric layers in a case where the filter module includes a laminate of the dielectric layers.

DETAILED DESCRIPTION OF PREFERRED EMBODIMENTS

A balanced/unbalanced filter module according to a first preferred embodiment will now be described with reference to FIGS. 1 to 8.

Figure 1:
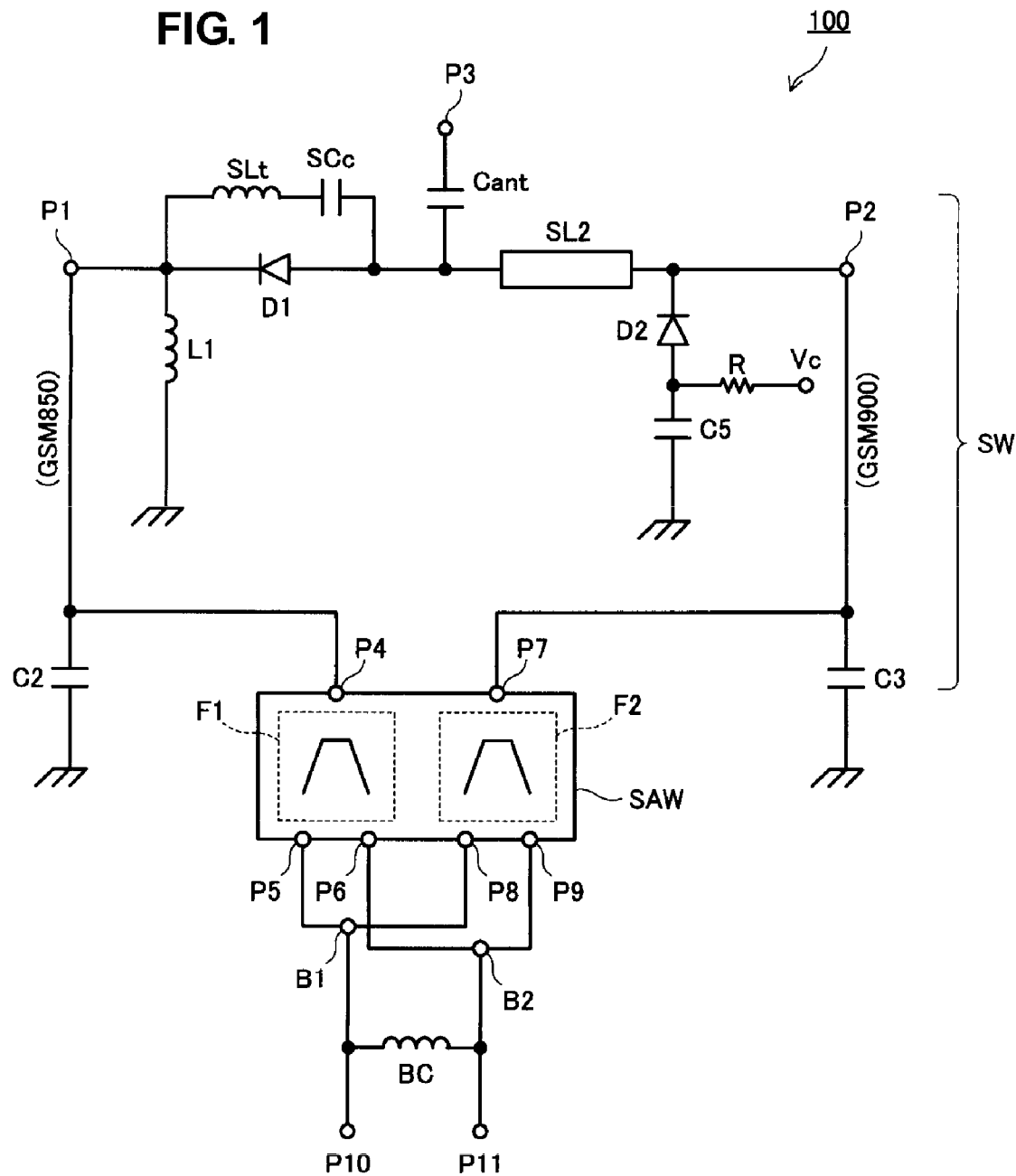
FIG. 1 is a circuit diagram of a balanced/unbalanced filter module according to a first preferred embodiment of the present invention.

FIG. 1 is a circuit diagram of this module. The balanced/unbalanced filter module 100 mainly includes a switch SW, SAW filters that include first and second balanced/unbalanced filters F1 and F2, and a balance coil BC that functions as a matching element.

The switch SW switches between a signal path between a first port P1 and a third port P3 and a signal path between a second port P2 and the third port P3. The first port P1 inputs and outputs GSM 850 (transmit signals in a frequency band of approximately 824 MHz to 849 MHz and receive signals in a frequency band of approximately 869 MHz to 894 MHz). The second port P2 inputs and outputs GSM 900 (transmit signals in a frequency band of approximately 880 MHz to 915 MHz and receive signals in a frequency band of approximately 925 MHz to 960 MHz). A diode D1, an inductor SLt, a capacitor SCc, and a choke coil L1 are provided between the first port P1 and the third port P3. A line (strip line) SL2, a diode D2, a capacitor C5, and a resistor R are provided between the second port P2 and the third port P3. A capacitor Cant is connected in series with the third port P3.

The operation of the switch SW is as follows. When a high-level signal is applied to a control signal input terminal Vc, the diodes D1 and D2 are turned on. This brings the diode D1 into conduction, so that a signal path between the first port P1 and the third port P3 is brought into conduction. On the other hand, the electrical length of the line SL2 is adjusted to be about a quarter of a wavelength in the frequency band of GSM 850. When the diode D2 is turned on, the port P2 side of the line SL2 is equivalently grounded, and the impedance viewed from the port P3 to the port P2 side is equivalently open.

When a low-level signal is applied to the control signal input terminal Vc, the diode D2 is turned off, so that a signal path is formed between the second port P2 and the third port P3 via the line SL2. On the other hand, when the diode D1 is turned off, the signal path between the first port P1 and the third port P3 is cut off.

In a state in which the diode D1 is turned off, the impedance viewed from the third port P3 to the first port P1 is open due to parallel resonance of the capacitance of the diode D1 and the inductance of the inductor SLt. The capacitor SCc functions as a DC blocking capacitor that causes the control current to flow through the diode D1 and not the inductor SLt when the diode D1 is turned on.

The SAW filters SAW include the first balanced/unbalanced filter F1, which passes signals in a first frequency band (GSM 850) and blocks signals in a second frequency band, and the second balanced/unbalanced filter F2, which passes signals in the second frequency band (GSM 900) and blocks signals in the first frequency band. A fourth port P4 for inputting and outputting unbalanced signals of the first balanced/unbalanced filter F1 is connected to the first port P1 of the switch SW. Balanced signals of the first balanced/unbalanced filter F1 are input and output through a fifth port P5 and a sixth port P6. Similarly, a seventh port P7 for inputting and outputting unbalanced signals of the second balanced/unbalanced filter F1 is connected to the second port P2 of the switch SW. Balanced signals of the second balanced/unbalanced filter F2 are input and output through an eighth port P8 and a ninth port P9.

The fifth port P5 and the eighth port P8 are connected to a first branch port B1. The fifth port P5 is one balanced I/O port of the first balanced/unbalanced filter, and the eighth port P8 is one balanced I/O port of the second balanced/unbalanced filter F2. The ninth port P9 and the sixth port P6 are connected to a second branch port B2. The ninth port P9 is the other balanced I/O port of the second balanced/unbalanced filter, and the sixth port P6 is the other balanced I/O port of the first balanced/unbalanced filter F1. Moreover, the balance coil BC is connected to a portion between the first branch port B1 and the second branch port B2. The balance coil BC functions as a matching element that performs impedance matching for balanced signals in the first frequency band (GSM 850) and balanced signals in the second frequency band (GSM 900). In this case, ports P10 and P11 are extended from the first and second branch ports B1 and B2 as balanced I/O ports.

The first balanced/unbalanced filter F1 passes signals in the first frequency band (GSM 850) and blocks signals in the second frequency band (GSM 900). Thus, in a state in which the signal path on the first port P1 side is selected by the switch SW, the balanced ports P10 and P11 function as balanced I/O ports for the first frequency band. On the other hand, the second balanced/unbalanced filter F2 passes signals in the second frequency band (GSM 900) and blocks signals in the first frequency band (GSM 850). Thus, in a state in which the signal path on the second port P2 side is selected by the switch SW, the balanced ports P10 and P11 function as balanced I/O ports for the second frequency band.

In this way, the pass band for one of the two filters F1 and F2 is a cut-off frequency band for the other filter. Thus, leakage of signals in the first and second frequency bands can be reduced, and one balanced I/O port can be shared with low loss.

A capacitor C2 is provided between the connection between the first port P1 and the fourth port P4 and ground, and a capacitor C3 is provided between the connection between the second port P2 and the seventh port P7 and ground. The capacitors C2 and C3 are provided for impedance matching of the first and second balanced/unbalanced filters F1 and F2 and the switch SW.

The electrical length between the fifth port P5 and the first branch port B1 in the first frequency band is substantially the same as the electrical length between the eighth port P8 and the first branch port B1 in the second frequency band. Moreover, the electrical length between the sixth port P6 and the second branch port B2 in the first frequency band is substantially the same as the electrical length between the ninth port P9 and the second branch port B2 in the second frequency band. Thus, the balance coil BC is connected to positions where phases are equal as viewed from the balanced ports of the first and second balanced/unbalanced filters F1 and F2. Accordingly, the wiring between these ports and addition of the matching element do not impair balancing characteristics, thereby maintaining satisfactory electrical characteristics.

Next, the structure of a typical laminate including dielectric layers with which the aforementioned balanced/unbalanced filter module is integrated will now be described with reference to FIGS. 2A to 4H.

Figure 2A:
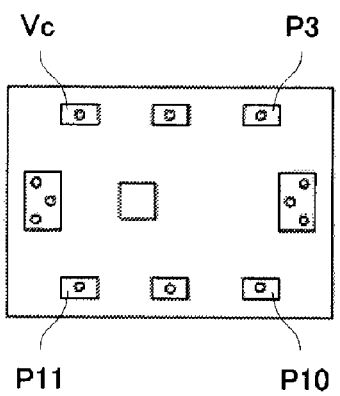
FIGS. 2A to 2H show conductor patterns in dielectric layers in a case where the filter module includes a laminate of the dielectric layers.
Figure 3A:
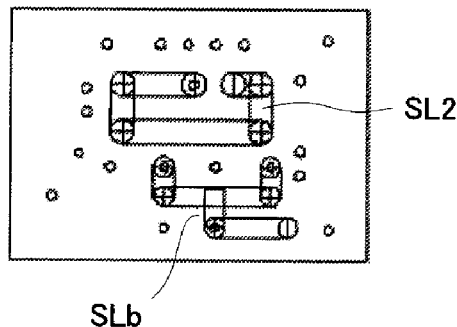
Figure 3B:
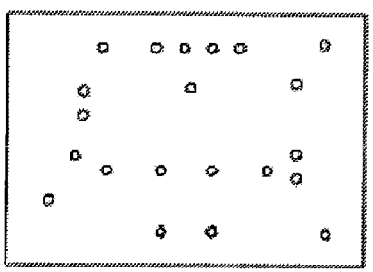
Figure 3C:
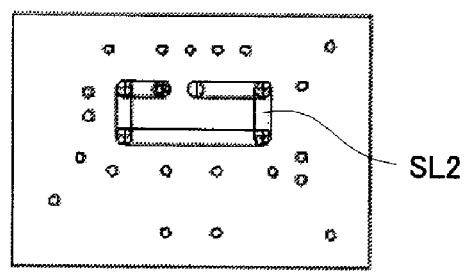
Figure 3C:
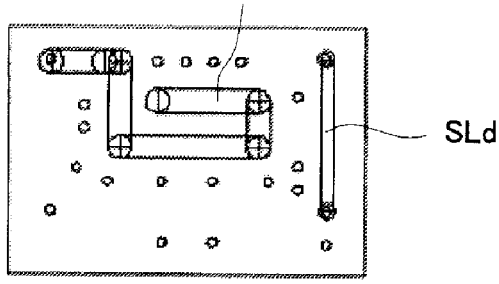
Figure 3E:
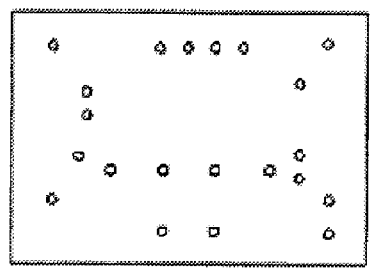
Figure 3F:
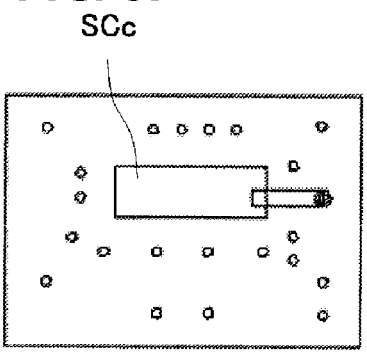
Figure 3G:
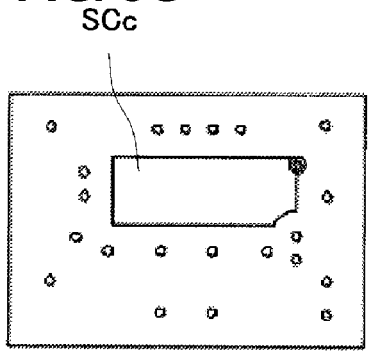
Figure 4A:
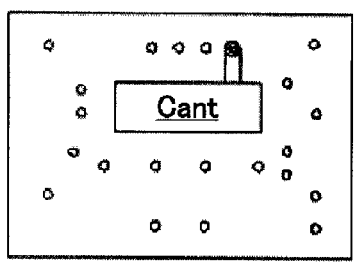
FIGS. 4A to 4H show conductor patterns in dielectric layers in a case where the filter module includes a laminate of the dielectric layers.
Figure 4B:
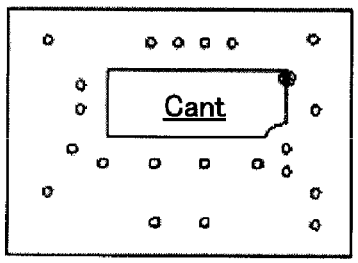
Figure 4C:
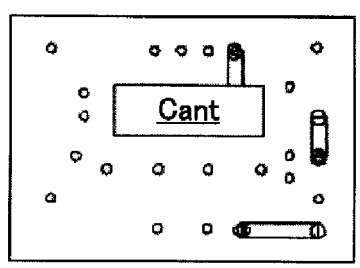
Figure 4D:
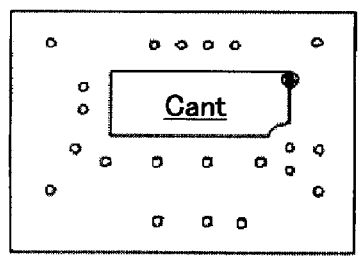
Figure 4E:
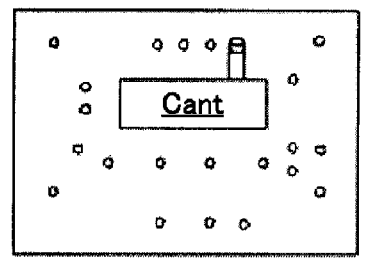
Figure 4F:
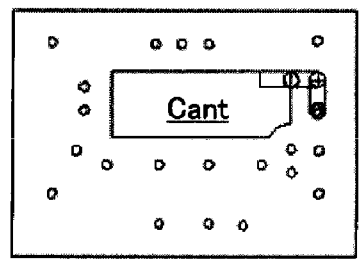
Figure 4G:
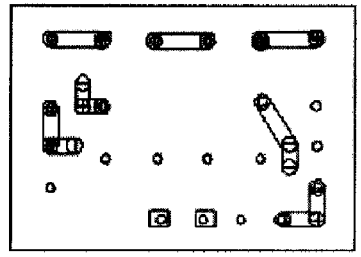
Figure 4H:
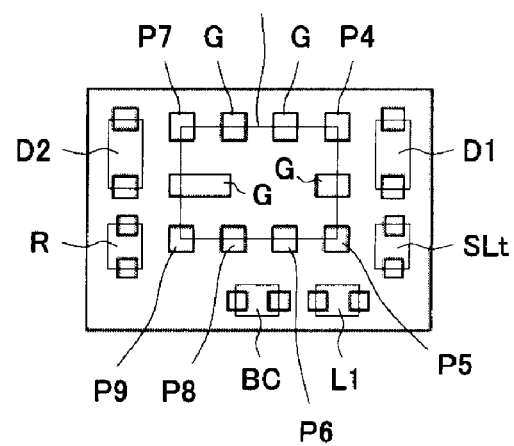

FIGS. 2A to 4H are plan views showing conductor patterns in individual layers of the plurality of dielectric layers. FIG. 2A shows the lowermost layer, and FIG. 4H shows the uppermost layer. The conductor patterns are shown separately in three figures, FIGS. 2A to 4H, for the sake of illustration. The reference numerals and letters of components in FIGS. 2A to 4H correspond to those of the circuit shown in FIG. 1. Reference letter GND in these drawings denotes a ground electrode.

In FIG. 2A, reference letter Vc denotes the control signal input terminal, reference letter P3 denotes a terminal corresponding to the third port P3, and reference letters P10 and P11 denote terminals corresponding to the balanced I/O ports P10 and P11.

The terminals Vc, P3, P10, and P11 are arranged so that the GND terminal is located between these terminals to prevent the terminals from interfering with each other.

Figure 2B:
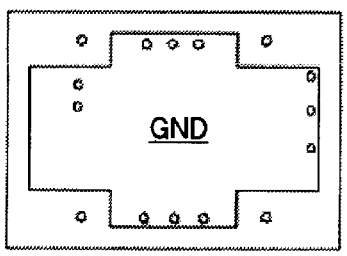

In FIG. 2B, the GND is placed between via holes that are connected to the terminals Vc, P3, P10, and P11 to prevent the via holes from interfering with each other.

Figure 2C:
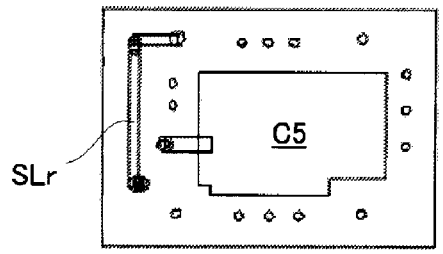

In FIG. 2C, a conductor pattern SLr is a wiring pattern between the resistor R and the control signal input terminal Vc shown in FIG. 1. In FIG. 2H, a conductor pattern SLb is a wiring pattern on the side of the balanced I/O ports P10 and P11.

Figure 2D:
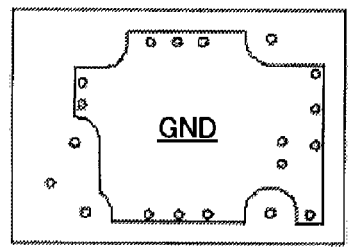
Figure 2E:
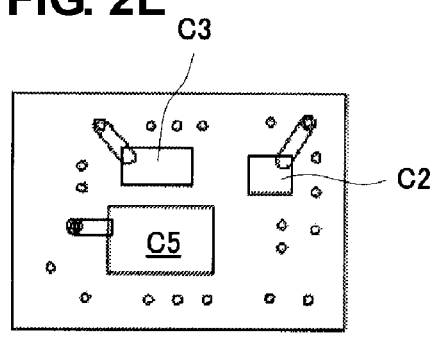
Figure 2F:
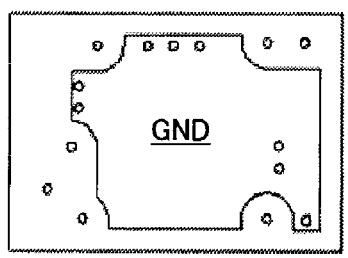
Figure 2G:
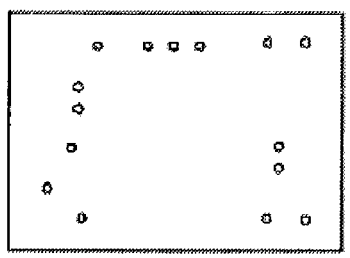
Figure 2H:
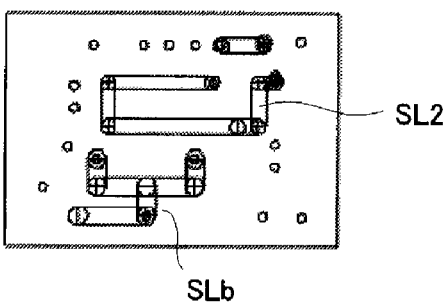

A conductor pattern C5 shown in FIGS. 2C and 2E opposes the GND shown in FIG. 2D so as to constitute a capacitor C5.

In FIG. 3A, the conductor pattern SLb is a wiring pattern on the side of the aforementioned balanced I/O ports. A conductor pattern SLd shown in FIG. 3D is a wiring pattern of a branch of the diode D1, the inductor SLt, and the choke coil L1 shown in FIG. 1. Conductor pattern components SCc shown in FIGS. 3F and 3G oppose each other so as to constitute the capacitor SCc shown in FIG. 1.

Conductor pattern components Cant shown in FIGS. 4A to 4F alternately overlap each other so as to constitute the capacitor Cant on the unbalanced I/O port P3 side shown in FIG. 1.

FIG. 4H shows the uppermost dielectric layer and various chip components that are mounted on the upper surface of the laminate composed of these dielectric layers. The diodes D1 and D2, the resistor R, the choke coil L1, the inductor SLt, the balance coil BC, and the SAW filters SAW are mounted, as shown in the drawing. In terminal portions of the SAW filters SAW, reference letter G corresponds to ground terminals, and reference letters P4 to P9 correspond to the fourth to ninth ports P4 to P9 shown in FIG. 1, respectively.

Although two SAW filters are preferably included in the first preferred embodiment, the number of SAW filters may be changed as necessary in accordance with the number of frequency bands to be used. For example, when the number of frequency bands to be used is three, the same advantageous effects as described above can be achieved by increasing the number of SAW filters to three.

In the first preferred embodiment, the two SAW filters in use are included in one package. This package is placed on the uppermost layer of the laminate so that the package covers the center of the plane surface of the uppermost layer of the laminate (the center of a plane surface formed by the dielectric layers). That is to say, the SAW filters SAW are placed on the uppermost layer of the laminate so that the location of the package of the SAW filters SAW covers the center of the plane surface formed by the uppermost dielectric layer, as shown in FIG. 4H.

In general, when an electronic component is mounted on a substrate with an automatic mounter, handling is performed by attaching the upper surface of the electronic component by vacuum suction. In an electronic component that includes chip components on the uppermost surface of a laminate of dielectric layers thereof, the uppermost surface of the electronic component needs to be flattened. Thus, previously, the whole of the portion (the entire surface of the uppermost layer) that surrounds various chip components that are mounted on the uppermost dielectric layer has had to be sealed with resin, or a metal casing has had to be provided on the laminate so that the metal casing covers the laminate.

However, in the present preferred embodiment, since the SAW filters placed on the uppermost layer of the laminate are packaged, the upper surface is flat, and the balanced/unbalanced filter module can be attached using this flat surface. Thus, sealing with resin or installation of a metal casing, which are described above, is not required. Accordingly, a balanced/unbalanced filter module can be manufactured at low cost, and stable handling can be achieved.

The balance coil BC, which is the matching element of the balanced I/O ports, is arranged so that the mounting position of the balance coil BC does not overlap the positions (the positions above a plane, as viewed from the top in the direction of stacking the dielectric layers) of the individual components, which constitute the switch SW shown in FIG. 1, as shown in FIGS. 2A to 4H. That is to say, the mounting position of the balance coil BC does not overlap the positions below the balance coil BC in the stacking direction, the conductor patterns of the capacitors Cant, SCc, and C5 being formed in the positions. Moreover, the mounting position of the balance coil BC does not overlap the mounting positions of the choke coil L1, the inductor SLt, the line SL2, the diodes D1 and D2, or the resistor R.

The balance coil BC is arranged to have such a relationship. Thus, matching can be achieved at the balanced I/O ports for the two frequency bands while the components other than the balance coil BC do not have an adverse affect on the matching circuit formed by the balance coil BC and the matching circuit formed by the balance coil BC does not have an adverse affect on the components or circuits other than the balance coil BC.

In the first preferred embodiment, the wiring on the balanced side and the wiring on the unbalanced side are arranged so that the positions of the wiring on the balanced side and the wiring on the unbalanced side do not overlap each other above a plane, as viewed from the top in the direction of stacking the dielectric layers, when possible. The GND layers are provided between the wiring on the balanced side and the wiring on the unbalanced side at portions that inevitably overlap each other. Such an arrangement is adopted. Thus, signals on the balanced and unbalanced sides do not interfere with each other.

Next, typical characteristics of the balanced/unbalanced filter module according to the first preferred embodiment will be described with reference to FIGS. 5A to 6C.

Figure 5A:
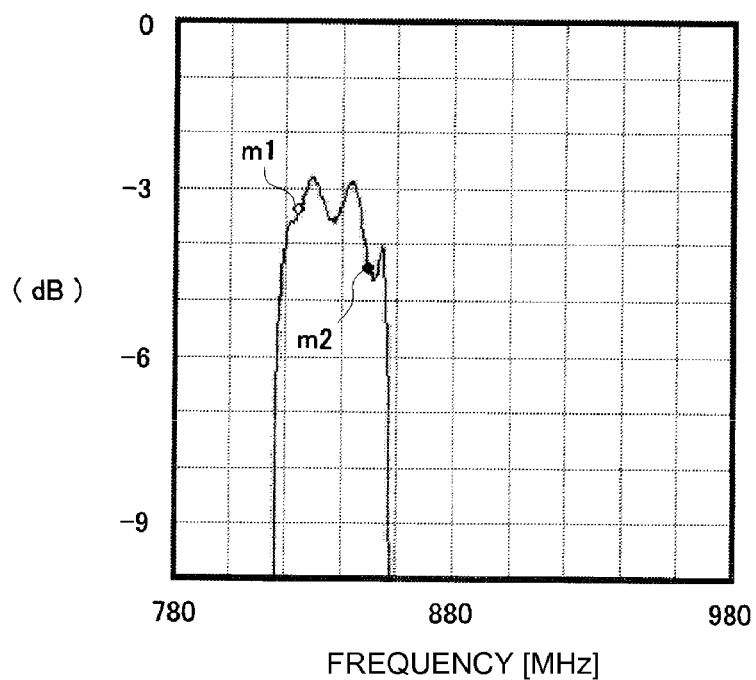
FIGS. 5A to 5C include a view of the insertion loss and impedance charts of a balanced I/O side and an unbalanced I/O side for GSM 850 in the filter module.
Figure 5B:
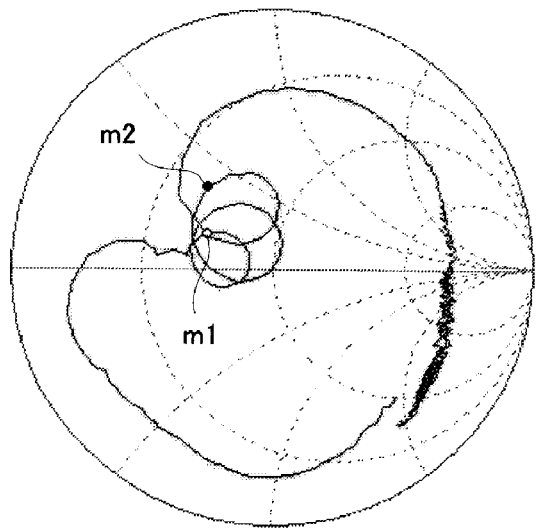
Figure 5C:
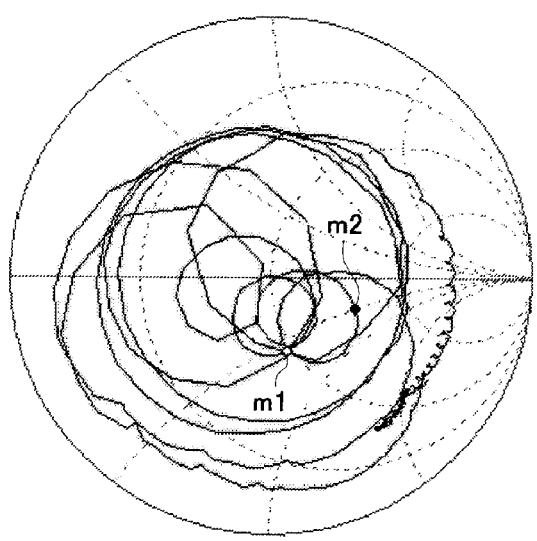
Figure 6A:
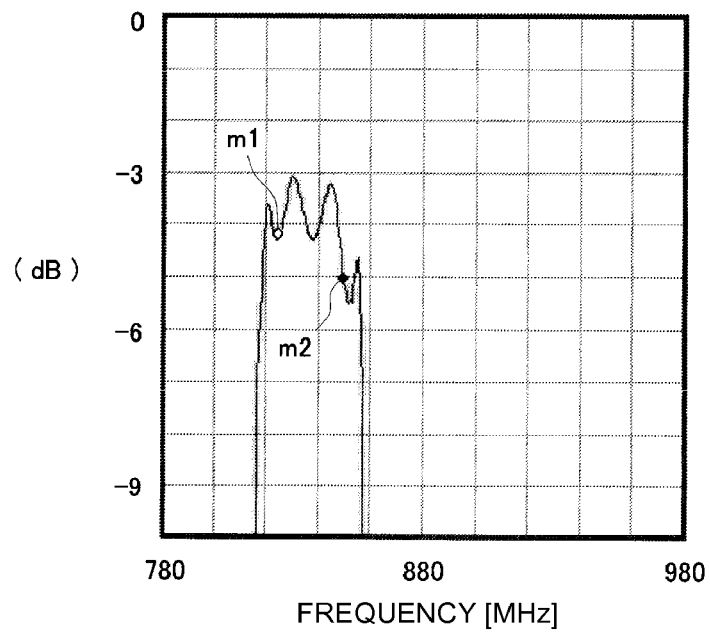
FIGS. 6A to 6C include a view and charts corresponding to those in FIG. 5 in a case where a balance coil is not provided.
Figure 6B:
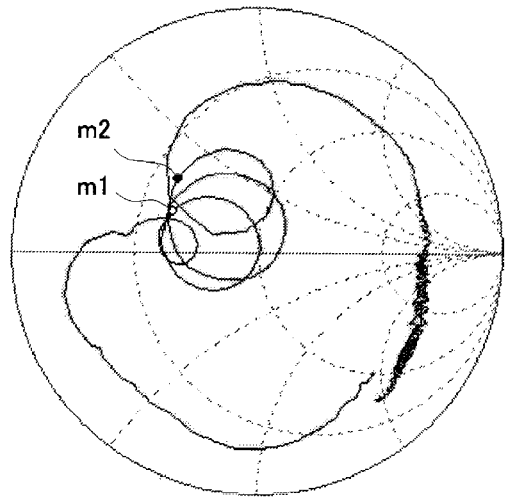
Figure 6C:
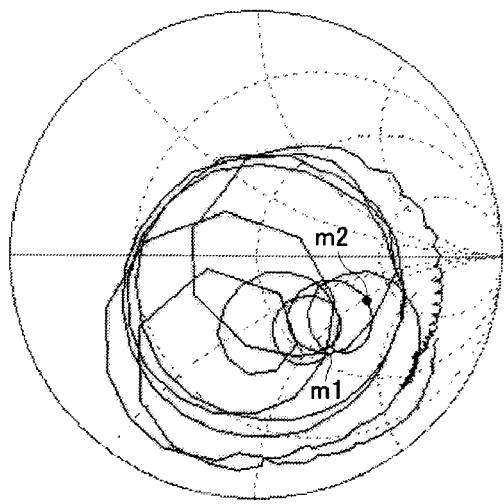

FIGS. 5A to 6C show the characteristics in a case where the signal path for GSM 850 is selected. FIGS. 5A to 5C show the characteristics of the balanced/unbalanced filter module shown in FIG. 1. FIGS. 6A to 6C show the characteristics in a case where the balance coil BC shown in FIG. 1 is not provided. FIGS. 5A and 6A show the frequency characteristics of the insertion loss, FIGS. 5B and 6B are an impedance charts (the Smith chart) of the third port P3, which is an unbalanced port, and FIGS. 5C and 6C are an impedance charts of the ports P10 and P11, which are balanced I/O ports.

As is apparent from comparison of FIGS. 5A to 5C and FIGS. 6A to 6C, when the balance coil BC is provided, the insertion loss is kept at about −3 dB to −4 dB in the frequency band of GSM 850, and the degree of the flatness is high, as shown in FIG. 5A. In contrast, when the balance coil BC is not provided, a change (ripple) in the insertion loss in the pass band is large, and the insertion loss is totally large, as shown in FIG. 6A.

Figure 7A:
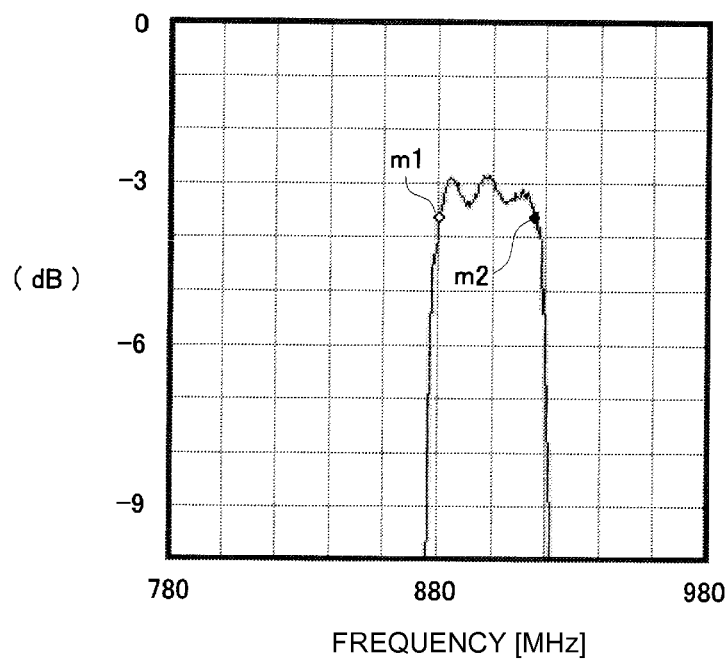
FIGS. 7A to 7C include a view of the insertion loss and impedance charts of the balanced I/O side and the unbalanced I/O side for GSM 900 in the filter module.
Figure 7B:
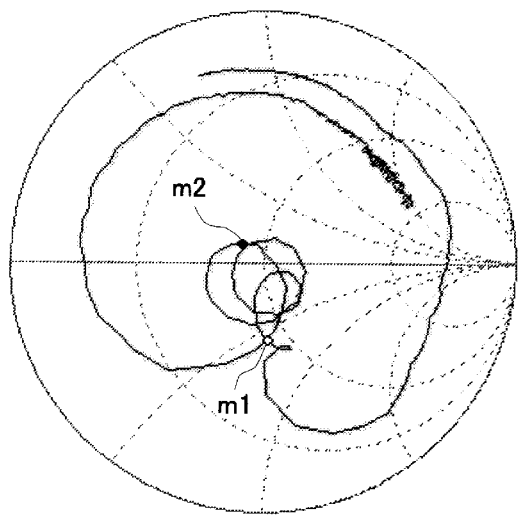
Figure 7C:
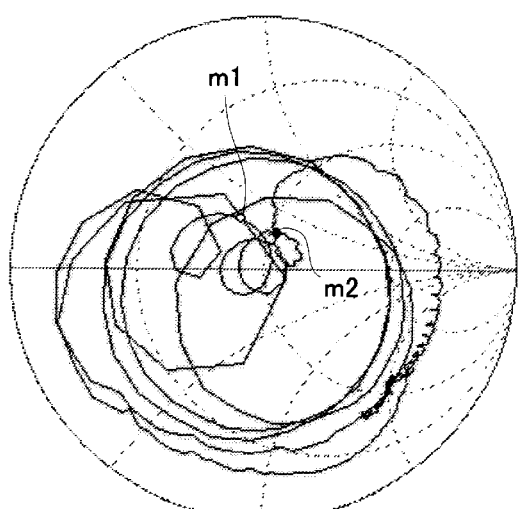
Figure 8A:
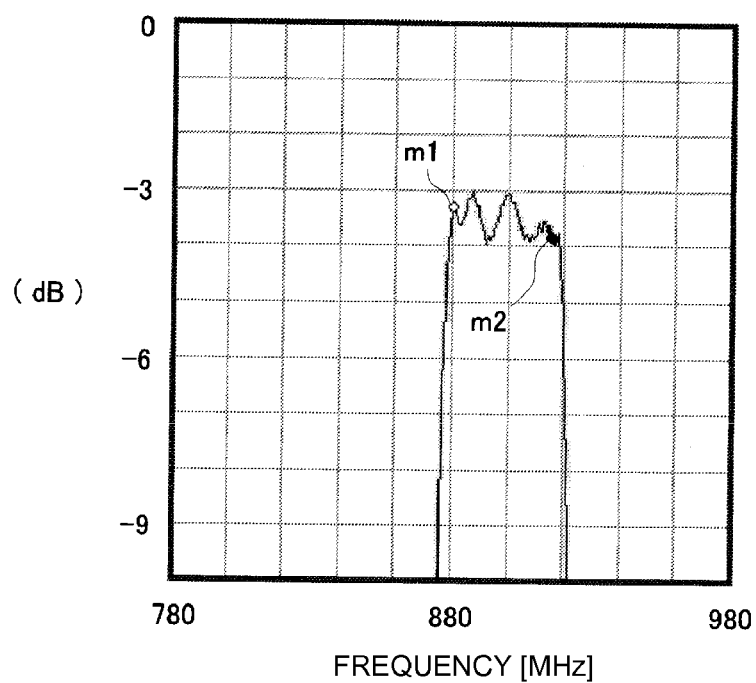
FIGS. 8A to 8C include a view and charts corresponding to those in FIG. 7 in a case where the balance coil is not provided.
Figure 8B:
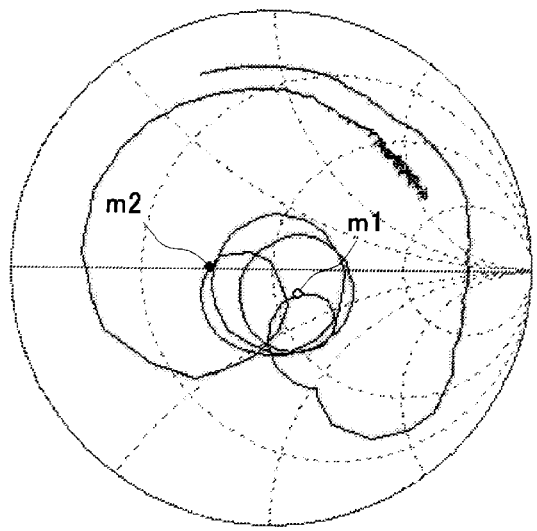
Figure 8C:
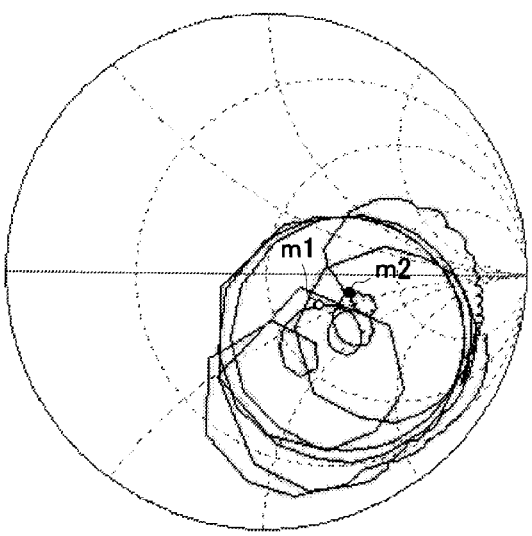

Similarly, FIGS. 7A to 8C show the characteristics in a case where the signal path for GSM 900 is selected. FIGS. 7A to 7C show the characteristics in a case where the balance coil BC exists. FIGS. 8A to 8C show the characteristics in a case where the balance coil BC does not exist.

Even in the case of GSM 900, as is apparent from comparison of FIGS. 7A to 7C and FIGS. 8A to 8C, when the balance coil BC is provided, the insertion loss is kept at about −3 dB to −4 dB in the frequency band of GSM 900, and the degree of the flatness is high, as shown in FIG. 7A. In contrast, when the balance coil BC is not provided, a change (ripple) in the insertion loss in the pass band is large, and the insertion loss is totally large, as shown in FIG. 8A.

Moreover, when the frequency is changed for GSM 850 from a marker m1 to a marker m2 shown in FIGS. 5A and 6A, the vector locus on the Smith chart changes, as shown in FIGS. 5B, 5C, 6B and 6C. When the balance coil BC is provided, the impedance of the unbalanced I/O port shown in FIG. 5B and the impedance of the balanced I/O port shown in FIG. 5C stay around the center of the Smith chart. In contrast, when the balance coil BC is not provided, these impedances deviate from the center of the Smith chart, as shown in FIGS. 6B and 6C.

Similarly, when the frequency is changed for GSM 900 from a marker m1 to a marker m2 shown in FIGS. 7A and 8A, the vector locus on the Smith chart changes, as shown in FIGS. 7B, 7C, 8B, and 8C. When the balance coil BC is provided, the impedance of the unbalanced I/O port shown in FIG. 7B and the impedance of the balanced I/O port shown in FIG. 7C stay around the center of the Smith chart. In contrast, when the balance coil BC is not provided, these impedances deviate from the center of the Smith chart, as shown in FIGS. 8B and 8C.

Accordingly, it can be determined that impedance matching of the balanced I/O ports can be achieved by the balance coil BC.

That is to say, the voltage standing wave ratio (VSWR) at the balanced I/O ports can be improved to a value equal to or less than 2.5 by providing the balance coil BC.

Next, a balanced/unbalanced filter module according to a second preferred embodiment will be described with reference to FIGS. 9 to 12.

Figure 9:
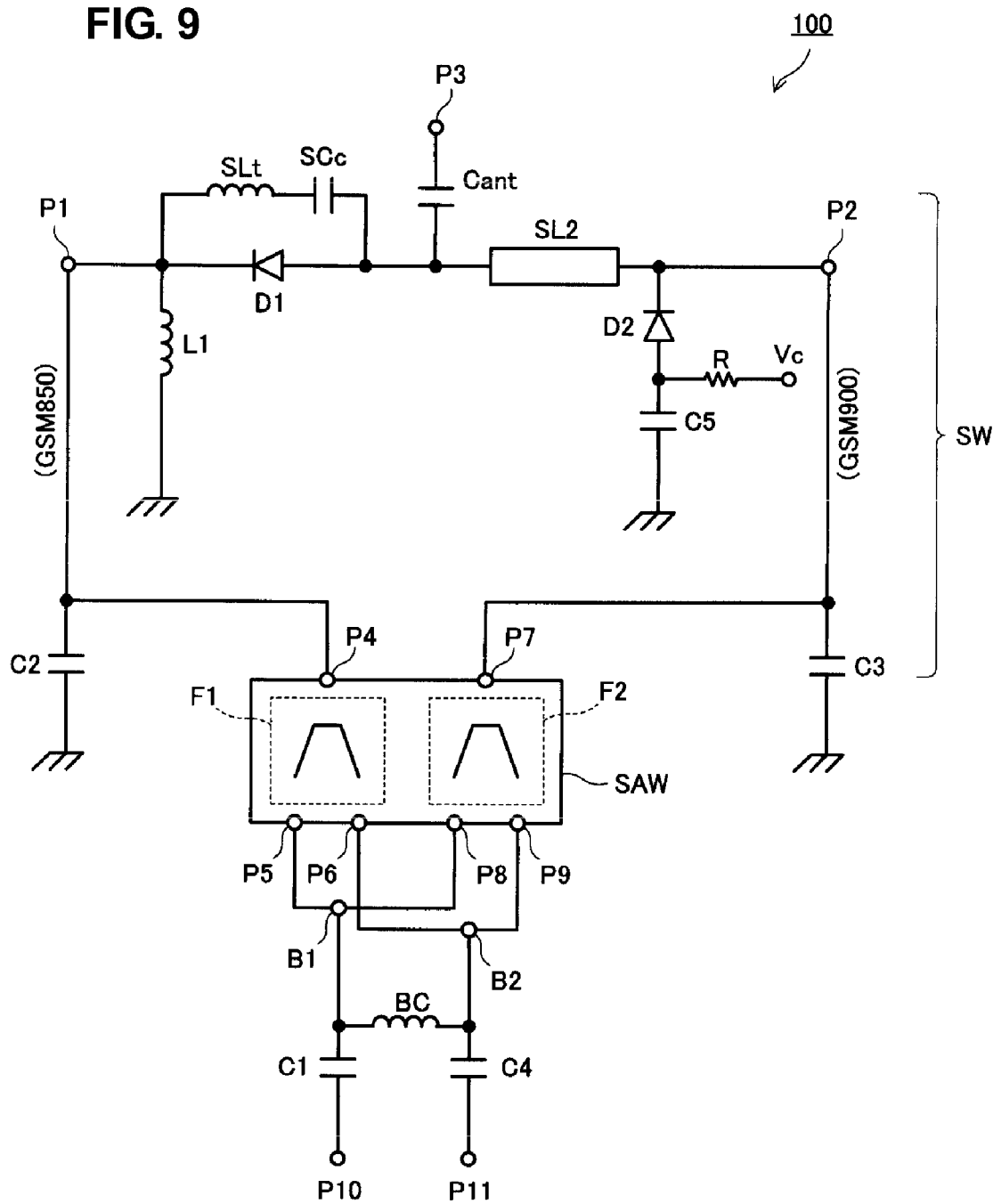
FIG. 9 is a circuit diagram of a balanced/unbalanced filter module according to a second preferred embodiment of the present invention.
Figure 10A:
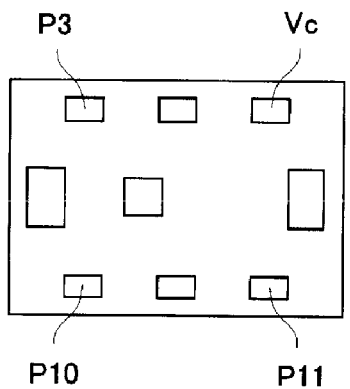
FIGS. 10A to 10H show conductor patterns in dielectric layers in a case where the filter module includes a laminate of the dielectric layers.
Figure 10B:
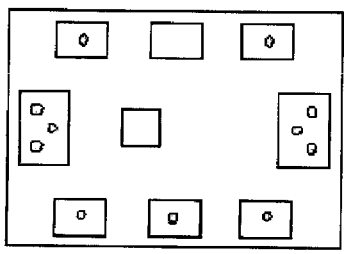
Figure 10C:
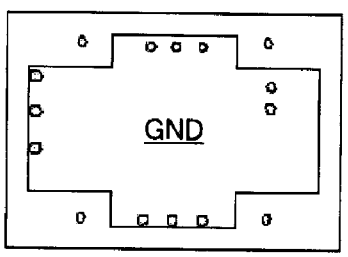
Figure 10D:
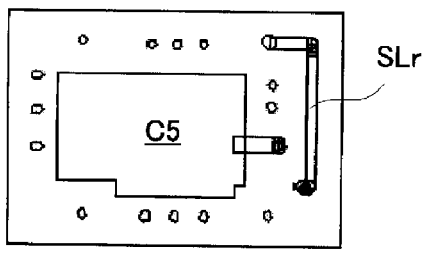
Figure 10E:
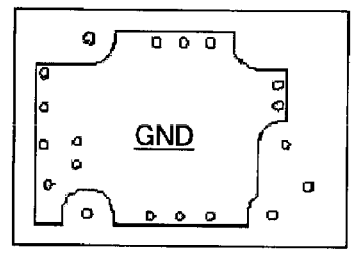
Figure 10F:
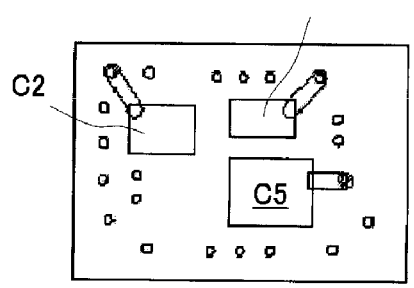
Figure 10G:
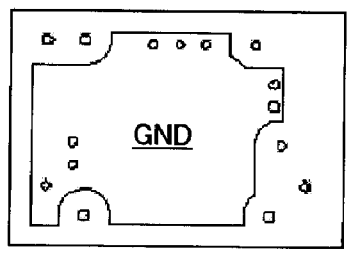
Figure 10H:
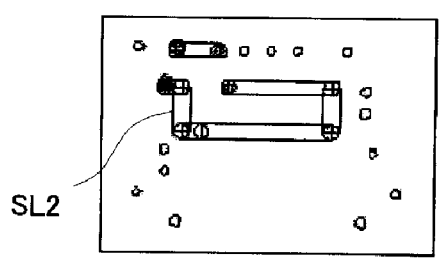
Figure 11A:
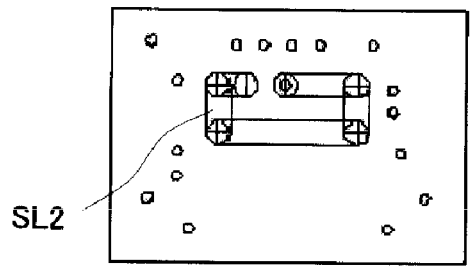
Figure 11E:
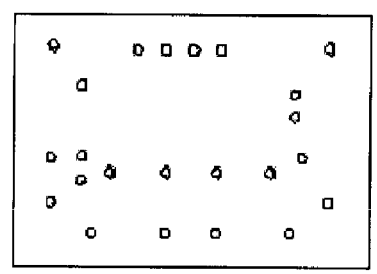
Figure 11B:
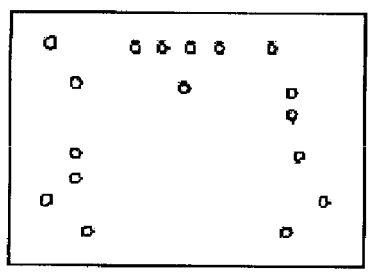
Figure 11B:
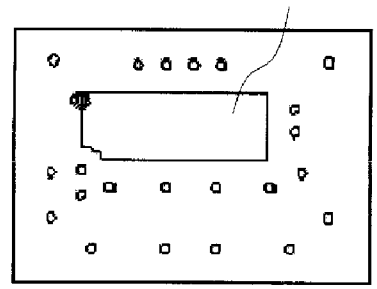
Figure 11C:
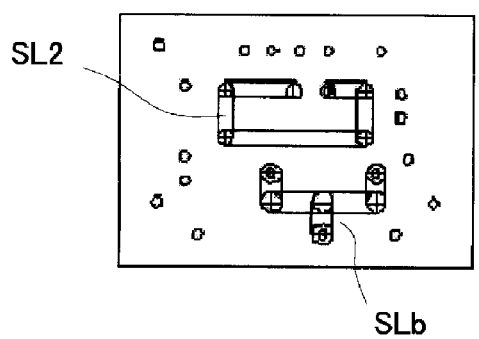
Figure 11C:
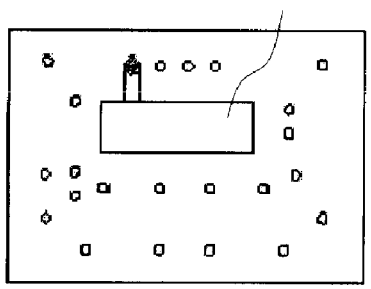
Figure 11D:
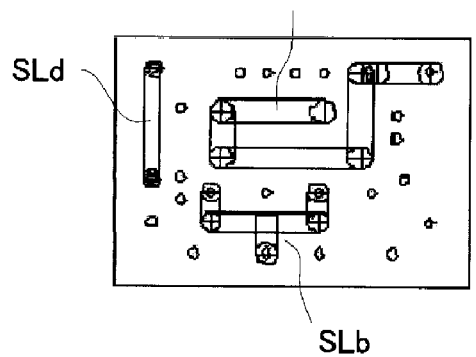

FIG. 9 is the circuit diagram. This balanced/unbalanced filter module is different from the balanced/unbalanced filter module shown in FIG. 1 as the first embodiment in that capacitors C1 and C4 are inserted into signal paths so as to be respectively connected in series with the balanced I/O ports P10 and P11 in this balanced/unbalanced filter module. The other portions are similar to those shown in FIG. 1. The capacitors C1 and C4, together with the balance coil BC, function as an impedance matching circuit for the balanced I/O ports P10 and P11 in the two frequency bands. Unlike the first embodiment, capacitors are provided in series, and an inductor is provided in parallel. Thus, impedance matching can be performed more accurately.

FIGS. 10A to 12G show conductor patterns in individual dielectric layers of the balanced/unbalanced filter module according to the second preferred embodiment in a case where a laminate of dielectric layers is integrated.

The reference numerals and letters of components in the drawings correspond to those of the circuit shown in FIG. 9. The conductor patterns provided in the individual dielectric layers are different from the examples shown in FIGS. 2A to 4H. However, basically, the conductor patterns are similar to each other.

Figure 12A:
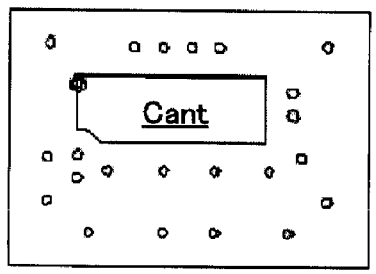
FIGS. 12A to 12G shows conductor patterns in dielectric layers in a case where the filter module includes a laminate of the dielectric layers.
Figure 12B:
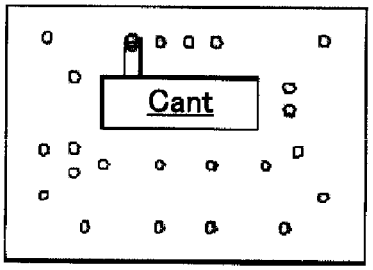
Figure 12C:
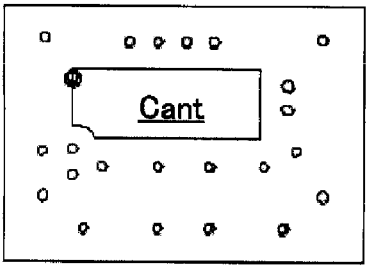
Figure 12D:
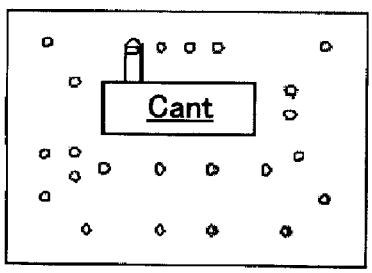
Figure 12E:
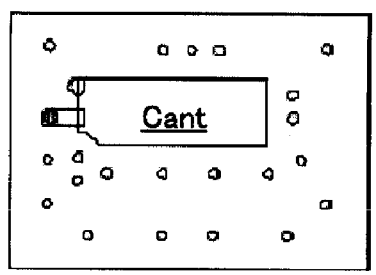
Figure 12F:
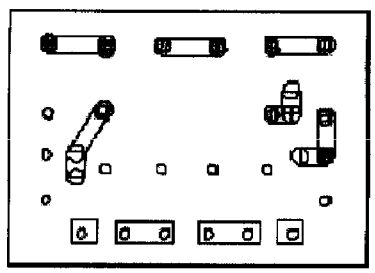
Figure 12G:
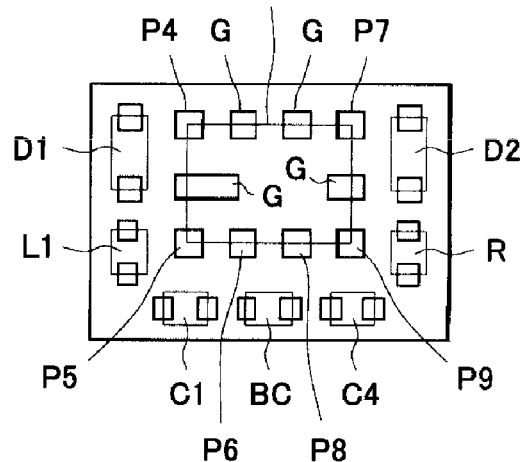

FIG. 12G shows the uppermost dielectric layer and various chip components that are mounted on the upper surface of the laminate including the dielectric layers. The diodes D1 and D2, the resistor R, the choke coil L1, the inductor SLt, the balance coil BC, the capacitors C1 and C4, and the SAW filters SAW are mounted, as shown in the drawing. In terminal portions of the SAW filters SAW, reference letter G corresponds to ground terminals, and reference letters P4 to P9 correspond to the fourth to ninth ports P4 to P9 shown in FIG. 1, respectively.

A recess for mounting the SAW filters SAW is formed in the central region of the dielectric laminate. After the SAW filters SAW are mounted in the recess with the terminal surface facing up, the terminals P5, P6, P8, and P9 of the SAW filters SAW are connected to the capacitors C1 and C4 by wire bonding. A pattern to which the individual terminals of the SAW filters SAW are connected may be formed on a surface of the laminate, the surface including no recess, and the SAW filters maybe mounted on the surface with the terminal surface facing down.

In the second preferred embodiment, the balance coil BC and the capacitors C1 and C4, which constitute the matching circuit of the balanced I/O ports, are arranged so that the balance coil BC and the capacitors C1 and C4 do not overlap the positions (the positions above a plane, as viewed from the top in the direction of stacking the dielectric layers) of the individual components, which constitute the switch SW shown in FIG. 9. That is to say, the balance coil BC and the capacitors C1 and C4 do not overlap the positions below the balance coil BC or the capacitors C1 and C4 in the stacking direction, the conductor patterns of the capacitors Cant, SCc, and C5 being formed in the positions. Moreover, the balance coil BC and the capacitors C1 and C4 do not overlap the mounting positions of the choke coil L1, the inductor SLt, the line SL2, the diodes D1 and D2, or the resistor R.

The balance coil BC and the capacitors C1 and C4 are arranged to have such a relationship. Thus, matching can be achieved at the balanced I/O ports for the two frequency bands while the components other than the balance coil BC and the capacitors C1 and C4 do not have an adverse affect on the matching circuit formed by the balance coil BC and the capacitors C1 and C4, and the matching circuit formed by the balance coil BC and the capacitors C1 and C4 does not have an adverse affect on the components or circuits other than the balance coil BC.

Instead of the SAW filters (surface acoustic wave filters), bulk acoustic filters (BAW filters) may be used.

Next, the structure of a communication apparatus according to a third preferred embodiment will be described with reference to FIG. 13.

Figure 13:
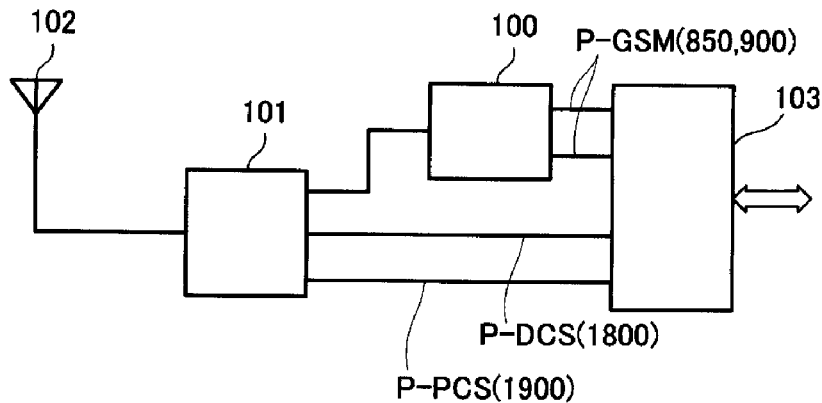
FIG. 13 shows the structure of a communication apparatus according to a third preferred embodiment of the present invention.
Figure 14:
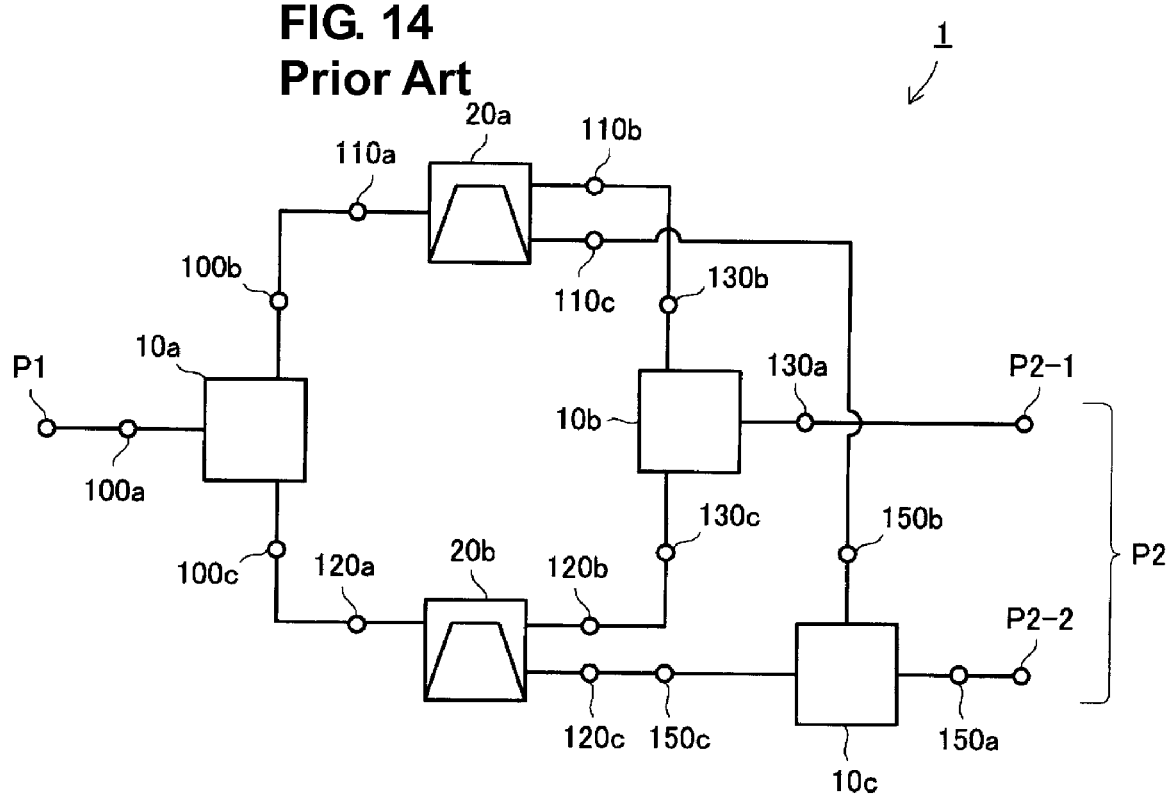
FIG. 14 shows the structure of a conventional balanced/unbalanced filter module.
Figure 15:
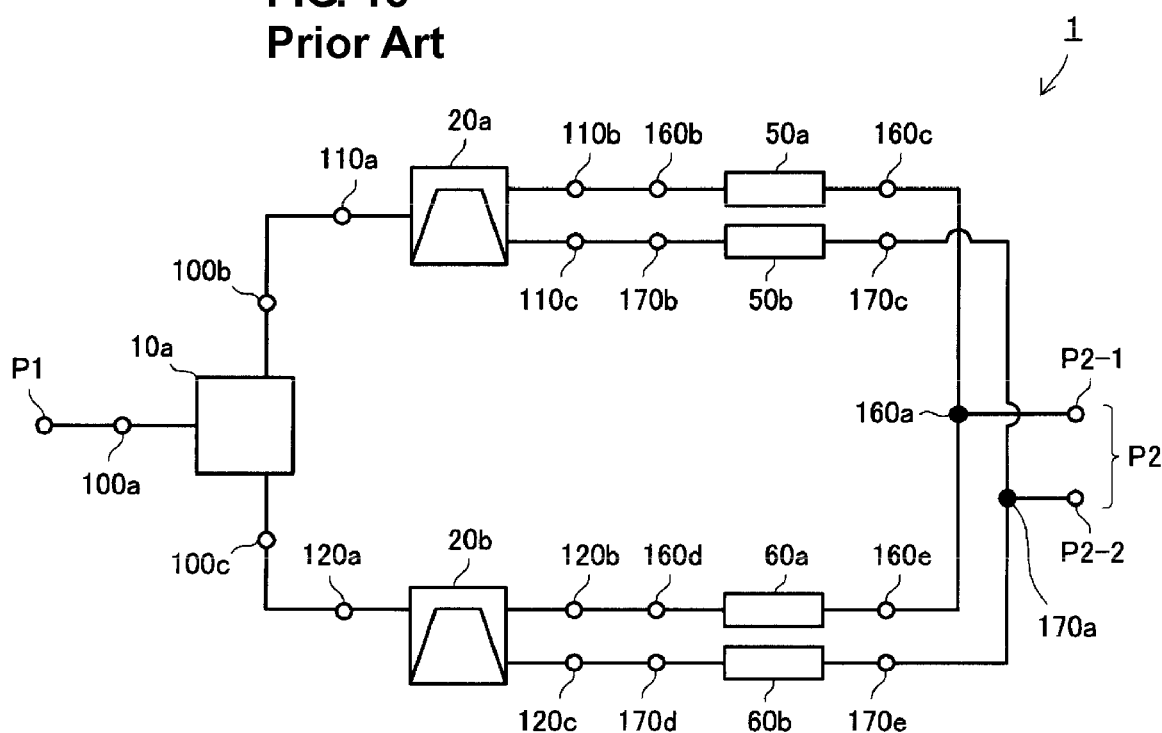
FIG. 15 shows the structure of another conventional balanced/unbalanced filter module.

FIG. 13 shows the structure of a high frequency circuit in a quad band mobile phone. The high frequency circuit includes a chip set 103 for triple bands, a balanced/unbalanced filter module 100, an antenna switch module 101 for triple bands, and an antenna 102. The antenna switch module 101 is an antenna switch for GSM 900, DCS 1800, and PCS 1900 and uses the antenna 102 in these frequency bands. Then, the balanced/unbalanced filter module 100 is connected to a port for GSM, and GSM 850 and GSM 900 are switched with the filter module 100. The chip set 103 for triple bands is a chip set for GSM 900, DCS 1800, and PCS 1900 and functions as an RF (radio frequency) front-end circuit for these triple bands. A mobile phone can be fabricated by connecting a baseband chip (not shown) to the chip set 103 for triple bands and providing I/O units in the baseband chip.

In this example, balanced I/O is performed for GSM 850 and GSM 900. Thus, balanced I/O ports of the balanced/unbalanced filter module 100 are represented by two terminals.

In this way, a quad band mobile phone can be readily fabricated by building up a high frequency circuit by integrating the balanced/unbalanced filter module 100 shown in the first or second embodiment with the chip set 103 for triple bands.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A balanced/unbalanced filter module, comprising:
   a switch that includes a first port, a second port, and a third port and is arranged to switch between a signal path between the third port and the first port and a signal path between the third port and the second port, the first port inputting and outputting unbalanced signals in a first frequency band, the second port inputting and outputting unbalanced signals in a second frequency band, the third port inputting and outputting unbalanced signals in the first frequency band and unbalanced signals in the second frequency band;
   a first balanced/unbalanced filter that includes a fourth port, a fifth port, and a sixth port, the fourth port being connected to the first port and inputting and outputting unbalanced signals in the first frequency band, the fifth and sixth ports inputting and outputting balanced signals in the first frequency band, a pass band of the first balanced/unbalanced filter being the first frequency band;
   a second balanced/unbalanced filter that includes a seventh port, an eighth port, and a ninth port, the seventh port being connected to the second port and inputting and outputting unbalanced signals in the second frequency band, the eighth and ninth ports inputting and outputting balanced signals in the second frequency band, a pass band of the second balanced/unbalanced filter being the second frequency band; and
   a matching element that is provided between a first branch port and a second branch port and performs impedance matching for balanced signals in the first frequency band and balanced signals in the second frequency band, the first branch port being connected to the fifth and eighth ports, the second branch port being connected to the sixth and ninth ports; wherein
   the electrical length between the fifth port and the first branch port in the first frequency band is substantially the same as the electrical length between the sixth port and the second branch port in the first frequency band, and the electrical length between the eighth port and the first branch port in the second frequency band is substantially the same as the electrical length between the ninth port and the second branch port in the second frequency band.

2. The balanced/unbalanced filter module according to claim 1, wherein the first and second balanced/unbalanced filters are balanced/unbalanced surface acoustic wave filters or bulk acoustic filters.

3. The balanced/unbalanced filter module according to claim 1, wherein the switch, the first and second balanced/unbalanced filters, and the matching element are integrated into a laminate including a plurality of dielectric layers.

4. The balanced/unbalanced filter module according to claim 3, wherein the switch includes a capacitor, an inductor, and a diode, and the matching element is located in a position that does not overlap the capacitor, the inductor, or the diode, as viewed from the top in a direction of stacking the dielectric layers.

5. The balanced/unbalanced filter module according to claim 3, wherein the first and second balanced/unbalanced filters are packaged into one package, and the package is placed on an uppermost layer of the laminate so that the package covers the center of a plane surface of the uppermost layer of the laminate.

6. The balanced/unbalanced filter module according to claim 3, wherein a control signal input terminal arranged to input control signals, a first I/O port terminal that is connected to the first branch port, a second I/O port terminal that is connected to the second branch port, and a third port terminal that is connected to the third port are disposed on a back surface of the lowermost layer of the laminate, and a GND terminal is provided between the individual terminals.

7. The balanced/unbalanced filter module according to claim 6, wherein the laminate includes a GND layer that includes a ground electrode, via holes that are electrically connected to the individual terminals are formed in the GND layer, and the ground electrode is provided between the via holes.

8. The balanced/unbalanced filter module according to claim 3, wherein wiring on a balanced side and wiring on an unbalanced side of the first and second balanced/unbalanced filters are provided in the laminate so that positions of the wiring on the balanced side and the wiring on the unbalanced side do not overlap each other above a plane, as viewed from the top in a direction of stacking the dielectric layers.

9. The balanced/unbalanced filter module according to claim 3, wherein a GND layer is provided between wiring on a balanced side and wiring on an unbalanced side of the first and second balanced/unbalanced filters at portions of the wiring on the balanced side and the wiring on the unbalanced side, the portions overlapping each other above a plane, as viewed from the top in a direction of stacking the dielectric layers.

10. A communication apparatus, comprising a high frequency circuit including the balanced/unbalanced filter module according to claim 1.

11. A balanced/unbalanced filter module, comprising:
a switch that includes a first port, a second port, and a third port and is arranged to switch between a signal path between the third port and the first port and a signal path between the third port and the second port, the first port inputting and outputting unbalanced signals in a first frequency band, the second port inputting and outputting unbalanced signals in a second frequency band, the third port inputting and outputting unbalanced signals in the first frequency band and unbalanced signals in the second frequency band;
a first balanced/unbalanced filter that includes a fourth port, a fifth port, and a sixth port, the fourth port being connected to the first port and inputting and outputting unbalanced signals in the first frequency band, the fifth and sixth ports inputting and outputting balanced signals in the first frequency band, a pass band of the first balanced/unbalanced filter being the first frequency band;
a second balanced/unbalanced filter that includes a seventh port, an eighth port, and a ninth port, the seventh port being connected to the second port and inputting and outputting unbalanced signals in the second frequency band, the eighth and ninth ports inputting and outputting balanced signals in the second frequency band, a pass band of the second balanced/unbalanced filter being the second frequency band; and
a matching element that is provided between a first branch port and a second branch port and performs impedance matching for balanced signals in the first frequency band and balanced signals in the second frequency band, the first branch port being connected to the fifth and eighth ports, the second branch port being connected to the sixth and ninth ports; wherein
the switch, the first and second balanced/unbalanced filters, and the matching element are integrated into a laminate including a plurality of dielectric layers; and
wiring on a balanced side and wiring on an unbalanced side of the first and second balanced/unbalanced filters are provided in the laminate so that positions of the wiring on the balanced side and the wiring on the unbalanced side do not overlap each other above a plane, as viewed from the top in a direction of stacking the dielectric layers.

12. A communication apparatus, comprising a high frequency circuit including the balanced/unbalanced filter module according to claim 11.

13. The balanced/unbalanced filter module according to claim 11, wherein the first and second balanced/unbalanced filters are balanced/unbalanced surface acoustic wave filters or bulk acoustic filters.

14. The balanced/unbalanced filter module according to claim 11, wherein the switch includes a capacitor, an inductor, and a diode, and the matching element is located in a position that does not overlap the capacitor, the inductor, or the diode, as viewed from the top in a direction of stacking the dielectric layers.

15. The balanced/unbalanced filter module according to claim 11, wherein the first and second balanced/unbalanced filters are packaged into one package, and the package is placed on an uppermost layer of the laminate so that the package covers the center of a plane surface of the uppermost layer of the laminate.

16. The balanced/unbalanced filter module according to claim 11, wherein a control signal input terminal arranged to input control signals, a first I/O port terminal that is connected to the first branch port, a second I/O port terminal that is connected to the second branch port, and a third port terminal that is connected to the third port are disposed on a back surface of the lowermost layer of the laminate, and a GND terminal is provided between the individual terminals.

17. The balanced/unbalanced filter module according to claim 16, wherein the laminate includes a GND layer that includes a ground electrode, via holes that are electrically connected to the individual terminals are formed in the GND layer, and the ground electrode is provided between the via holes.

18. A balanced/unbalanced filter module, comprising:
a switch that includes a first port, a second port, and a third port and is arranged to switch between a signal oath between the third port and the first port and a signal path between the third port and the second port, the first port inputting and outputting unbalanced signals in a first frequency band, the second port inputting and outputting unbalanced signals in a second frequency band, the third port inputting and outputting unbalanced signals in the first frequency band and unbalanced signals in the second frequency band;
a first balanced/unbalanced filter that includes a fourth port, a fifth port, and a sixth port, the fourth port being connected to the first port and inputting and outputting unbalanced signals in the first frequency band, the fifth and sixth ports inputting and outputting balanced signals in the first frequency band, a pass band of the first balanced/unbalanced filter being the first frequency band;
a second balanced/unbalanced filter that includes a seventh port, an egihth port, and a ninth port, the seventh port being connected to the second port and inputting and outputting unbalanced signals in the second frequency band, the eighth and ninth ports inputting and outputting balanced signals in the second frequency band, a pass band of the second balanced/unbalanced filter being the second frequency band; and
a matching element that is provided between a first branch port and a second branch port and performs impedance matching for balanced signals in the first frequency band and balanced signals in the second frequency band, the first branch port being connected to the fifth and eighth ports, the second branch port being connected to the sixth and ninth ports; wherein the switch, the first and second balanced/unbalanced filters, and the matching element are integrated into a laminate including a plurality of dielectric layers; and a GND layer is provided between wiring on a balanced side and wiring on an unbalanced side of the first and second balanced/unbalanced filters at portions of the wiring on the balanced side and the wiring on the unbalanced side, the portions overlapping each other above a plane, as viewed from the top in a direction of stacking the dielectric layers.

19. A communication apparatus, comprising a high frequency circuit including the balanced/unbalanced filter module according to claim 18.

20. The balanced/unbalanced filter module according to claim 18, wherein the first and second balanced/unbalanced filters are balanced/unbalanced surface acoustic wave filters or bulk acoustic filters.

21. The balanced/unbalanced filter module according to claim 18, wherein the switch includes a capacitor, an inductor, and a diode, and the matching element is located in a position that does not overlap the capacitor, the inductor, or the diode, as viewed from the top in a direction of stacking the dielectric layers.

22. The balanced/unbalanced filter module according to claim 18, wherein the first and second balanced/unbalanced filters are packaged into one package, and the package is placed on an uppermost layer of the laminate so that the package covers the center of a plane surface of the uppermost layer of the laminate.

23. The balanced/unbalanced filter module according to claim 18, wherein a control signal input terminal arranged to input control signals, a first I/O port terminal that is connected to the first branch port, a second I/O port terminal that is connected to the second branch port, and a third port terminal that is connected to the third port are disposed on a back surface of the lowermost layer of the laminate, and a GND terminal is provided between the individual terminals.

24. The balanced/unbalanced filter module according to claim 23, wherein the laminate includes a GND layer that includes a ground electrode, via holes that are electrically connected to the individual terminals are formed in the GND layer, and the ground electrode is provided between the via holes.

* * * * *